United States Patent
Wang (12) 
(10) Patent No.: US 6,651,198 B1
(45) Date of Patent: Nov. 18, 2003

(54) SYSTEM AND METHOD FOR TESTING ON-CHIP MODULES AND THE INTERCONNECTIONS BETWEEN ON-CHIP MODULES

(75) Inventor: Cheng-Ping Wang, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/478,844

(22) Filed: Jan. 7, 2000

Related U.S. Application Data
(60) Provisional application No. 60/116,625, filed on Jan. 19, 1999.

(51) Int. Cl.$^7$ .................... G01R 31/28; G01R 31/3187

(52) U.S. Cl. ...................................... 714/726; 714/727

(58) Field of Search ............................... 714/326, 327, 714/726, 727, 728

(56) References Cited

U.S. PATENT DOCUMENTS

| | | | | |
|---|---|---|---|---|
| 3,806,891 A | * | 4/1974 | Eichelberger et al. ...... | 714/731 |
| 5,260,949 A | * | 11/1993 | Hashizume et al. ........ | 714/731 |
| 5,488,613 A | * | 1/1996 | Sridhar ...................... | 714/731 |
| 5,568,492 A | * | 10/1996 | Flint et al. .................. | 714/724 |
| 5,636,228 A | * | 6/1997 | Moughanni et al. ......... | 714/25 |
| 5,644,261 A | | 7/1997 | Frisch et al. | |
| 5,804,960 A | * | 9/1998 | El Ayat et al. ............ | 324/158.1 |
| 5,911,039 A | * | 6/1999 | Hashizume et al. ......... | 714/30 |
| 6,079,040 A | * | 6/2000 | Hom et al. ................. | 714/738 |
| 6,191,603 B1 | * | 2/2001 | Muradali et al. ......... | 324/158.1 |

FOREIGN PATENT DOCUMENTS

| EP | 0 822 497 A | 2/1988 |
|---|---|---|

OTHER PUBLICATIONS

"A cost analysis study of deposited–MCM active substrates for testability purposes" Oliver at al □□ 1996 IEEE Multi-–Chip Module Conference, 1996. MCMC–96, Proceedings., pp.: 80–85□□ Feb. 6–7, 1996□□ .*

"DfT techniques for first–time right MCMs–exemplified by a Pentium MCM system" Wysse et al. 1998 International Conference on Mulitchip Modules and High Density Packaging pp: 190–195, Apr. 15–17, 1998.*

* cited by examiner

*Primary Examiner*—Albert Decady
*Assistant Examiner*—Cynthia Britt
(74) *Attorney, Agent, or Firm*—Carlton H. Hoel; W. James Brady; Frederick J. Telecky, Jr.

(57) ABSTRACT

An improved system for testing the operation of component modules and the interconnections therebetween of an integrated circuit (10) formed on a semiconductor chip is provided which consists of several component modules, each with an associated input scan cell (76) and output scan cell (102) when necessary. A component module may have both an input scan cell (76) and an output scan cell (102) unless the input or output of that component module occurs on the boundary of the integrated circuit (10). Each output scan cell (102) has a mode select signal (122) which indicates either input test mode or output test mode. The improved scan test system uses two process steps to verify the operational integrity of the entire integrated circuit (10). During the first step of the scan test, non-adjacent component modules have their mode select signals set to output test mode, and component modules existing between the non-adjacent component modules have their mode select signals set to input test mode. During the second step of the scan test, all mode select signals are reset to the opposite setting. After the second step of the scan test, the operational integrity of all component modules and the interconnections therebetween is verified. During normal operation of the integrated circuit (10), all mode select signals are set to output test mode which allows signals to pass directly between the component modules of the integrated circuit.

24 Claims, 5 Drawing Sheets

SYSTEM AND METHOD FOR TESTING ON-CHIP MODULES AND THE INTERCONNECTIONS BETWEEN ON-CHIP MODULES

This application claims priority under 35 USC §119 (e)(1) of Provisional Application No. 60/116,625, filed Jan. 19, 1999.

TECHNICAL FIELD OF THE INVENTION

This invention relates generally to testing of electrical circuits and more particularly to a system and method for testing on-chip modules and the interconnections between on-chip modules in a modularized integrated circuit.

BACKGROUND OF THE INVENTION

Integrated circuits generally consist of several on-chip modules interconnected to form a single integrated circuit. In order to verify the operational integrity of the integrated circuit, the operation of each module must be verified to ensure that the proper output signal is produced for a given input signal. In addition, the interconnections between the modules must be verified to ensure that signals are passed between the modules correctly.

Testing systems, referred to as scan test systems, are designed into the integrated circuit. These test systems allow test signals to be input to each module and the associated output signals can then be verified. In addition, a test signal can be introduced at the origin of an interconnection between two modules and verified at the termination point of the interconnection. The basic component of scan test systems is the scan cell consisting of a multiplexer and a shift register. Each electrical component introduced into the data path of a circuit necessarily causes processing delays within that circuit. Thus, a circuit with two multiplexers on a data path will take longer to process a given input signal than a circuit with only one multiplexer.

Currently, modularized integrated circuit testing is accomplished by a four step process. For purposes of this discussion, Module. A and Module B are interconnected such that the output of Module A is connected to the input of Module B. Standard testing system design inserts two scan cells into the interconnection between two modules. Scan cells can both capture a signal so it can be tested and introduce a test signal to the input of a module so it can be processed. In this example, a first scan cell is attached to the output of Module A, and a second scan cell is attached to the input of Module B. Thus, there is a signal path between the first and second scan cells which connect Module A and Module B. First, a test signal is introduced to the input pins of Module A. The output of Module A is then captured by the first scan cell where it is made available for verification. Second, a test signal is introduced to the second scan cell which is connected to the input of Module B. The second scan cell forwards the test signal to Module B where it is processed, and the output of Module B is then read and verified. Third, the first scan cell, which is connected to the output of Module A, must be verified for a properly functioning signal path. In order to accomplish this, a signal is introduced into the first scan cell and the output of that scan cell is captured and verified. Fourth, the signal path between the first scan cell and the second scan cell must be verified. This is accomplished by introducing a test signal into the first scan cell which is then forwarded to the second scan cell. The test signal is captured by the second scan cell, which is connected to the input of Module B, where it is read and verified. Thus, it takes four steps to verify that Module A, Module B, and the signal path between Module A and Module B operate as intended.

The four-step integrated circuit testing procedure described above is unnecessarily time consuming, and it requires several electrical components. In addition, the necessity of test circuitry built directly into the integrated circuit introduces delays into the normal processing of the integrated circuit. Therefore, the aforementioned integrated circuit testing process is both cumbersome and inefficient.

SUMMARY OF THE INVENTION

From the foregoing, it may be appreciated that a need has arisen for an improved system and method for verifying the operational integrity of the modules within an integrated circuit and the interconnections between those modules. In accordance with the present invention, an improved system and method of testing modules within an integrated circuit and the interconnections between those modules is provided which substantially reduces disadvantages or problems associated with conventional integrated circuit testing procedures.

According to one embodiment of the present invention, there is provided a system for testing the operation of on-chip modules and the interconnections between those on-chip modules that comprises an output scan cell consisting of a multiplexer and a shift register, an input scan cell consisting of a shift register only, and a mode select signal which selects either input signal path testing or output signal path testing. This design allows for complete operational integrity testing in two steps.

The present invention provides various technical and operational advantages over conventional integrated circuit testing designs. One important technical advantage of the present invention is that fewer steps are necessary to complete testing of the operational integrity of an integrated circuit. Another important technical advantage is the elimination of a multiplexer thereby reducing the delay introduced into the normal operation of the integrated circuit by the existence of the test circuit components. Other advantages may be readily ascertainable by those skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings wherein like reference numbers represent like parts, in which.

DETAILED DESCRIPTION OF THE DRAWINGS

Figure 1:
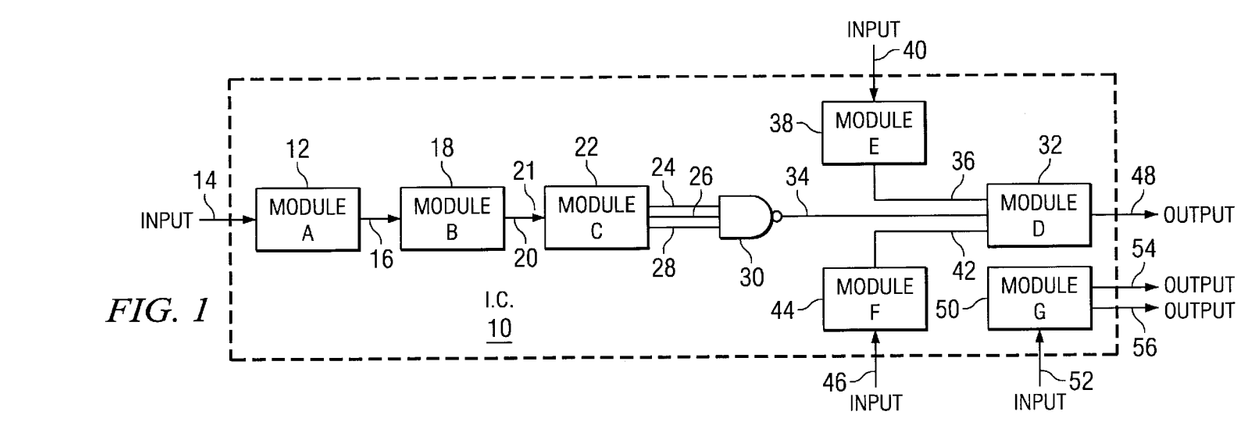
FIG. 1 is an overview block diagram illustrating various component modules and the interconnections therebetween in a modularized integrated circuit.

Referring to FIG. 1, an integrated circuit formed on a semiconductor chip is generally indicated at 10. An Integrated circuit 10 is often composed of several component modules which may be interconnected. Each component module is itself an electrical circuit design having inputs and outputs. These component modules may be interconnected in order to perform a more complex operation, or these component modules may function alone to provide outputs for a given set of inputs. After an integrated circuit is formed on a semiconductor chip, a scan test must be performed to ensure the proper functioning of the integrated circuit. This is accomplished by testing each component module and the interconnections between those modules. The testing system is designed into the integrated circuit and is a permanent part thereof. Thus, test signal input pins and output pins are provided which are used solely for verifying the operational integrity of the component modules and interconnections which comprise the integrated circuit. A mode select signal for each component module selects the operational mode of the component module so that it is either testing the integrated circuit or operating normally.

Referring again to FIG. 1, a series of component modules and the interconnections between those modules is illustrated. A component Module A 12 receives an input signal 14 from outside integrated circuit 10. Module A 12 processes input signal 14 and places its output on a Module A output 16, which is interconnected with a Module B 18 and provides an input signal for Module B 18. Module B 18 processes the input signal and places its output on a Module B output 20, which is interconnected with a Module C 22 and provides a Module C input 21. Module C 22 processes the input signal and generates output signals 24, 26, and 28. Output signals 24, 26, and 28 are inputs to a three input NAND gate 30.

NAND gate 30 provides a first Module D input signal 34 to a Module D 32, which has three input signals. A second Module D input signal 36 is provided by a Module E 38. Module E 38 receives an input signal 40 from outside the integrated circuit. Module E 38 processes input signal 40 and generates an output signal which acts as second Module D input signal 36. A third Module D input signal 42 is provided by Module F 44. Module F 44 receives an input signal 46 from outside the integrated circuit and processes input signal 46 to generate an output signal which will act as third Module D input signal 42. Finally, Module D 32 processes first Module D input signal 34, second Module D input signal 36, and third Module D input signal 42 to generate a Module D output signal 48, which is placed on an output pin for use outside of integrated circuit 10.

A Module G 50 is an example of an integrated circuit component module which is not interconnected with other component modules within an integrated circuit. Module G 50 receives an input signal 52 from outside of integrated circuit 10. Module G 50 processes input signal 52 and generates output signals 54 and 56 for use outside of integrated circuit 10. The above-described illustrative integrated circuit 10 of FIG. 1 notably does not show the testing system required in such an integrated circuit. The testing system for an integrated circuit, such as integrated circuit 10, will be discussed with reference to FIGS. 2, 3, 4a, 4b, and 4c.

Figure 2:
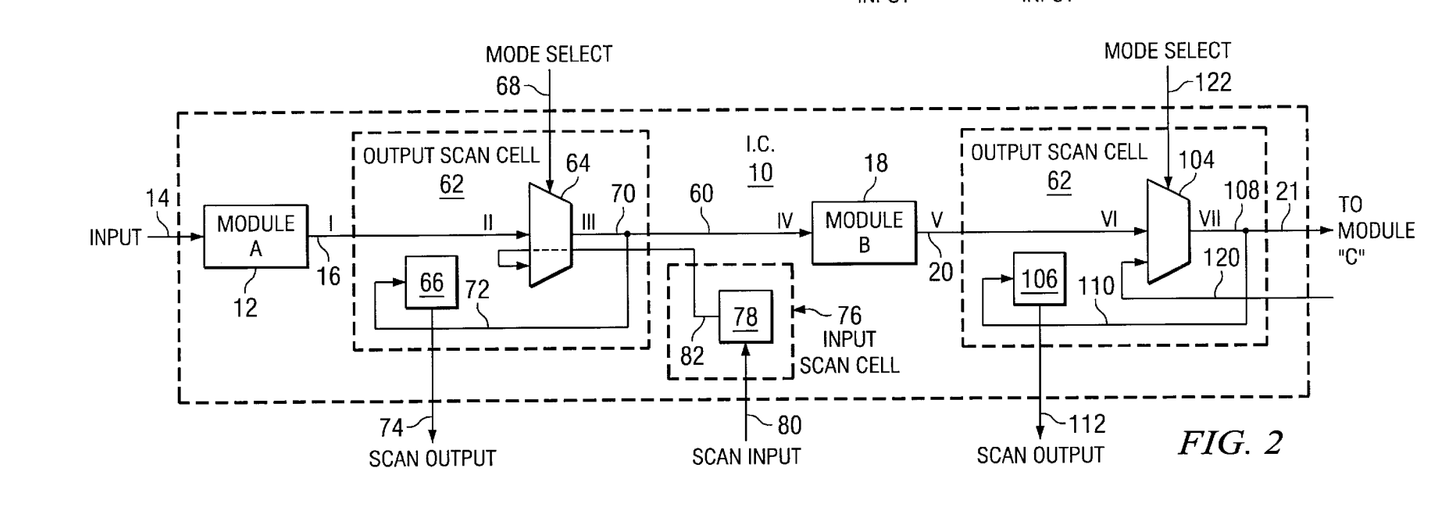
FIG. 2 is a schematic block diagram illustrating basic scan cells associated with a direct interconnection between two modules on an integrated circuit.

FIG. 2 illustrates Module A 12, Module B 18, and the interconnections between those modules indicated by Module A output 16 in FIG. 1. Referring to FIG. 2, Module A 12 is a component module within an integrated circuit design which will be formed on a single semiconductor chip. Module B 18 is also an integrated circuit component module which is interconnected with Module A 12. Module A input 14 may come from outside integrated circuit 10 or from other modules within integrated circuit 10. Module A input 14 provides the input signal to Module A 12 which processes the signal and generates Module A output 16. A Module B input 60 provides the input signal to Module B 18 which processes the signal and generates Module B output 20.

Scan test systems designed into integrated circuits function to verify the operational integrity of each individual component module within the integrated circuit as well as the interconnections between those modules. The present invention provides for a two-step scan test of the integrated circuit while reducing both the number of steps and the number of multiplexers required as compared to current integrated circuit scan test designs. The present invention first verifies the operational integrity of Module A 12 and then verifies the operational integrity Module B 18. After both modules are verified to function correctly, the interconnection between the modules is guaranteed to function properly due to the unique design of the present scan test system.

The present invention uses two types of scan cells to design scan test systems for integrated circuits. First is an output scan cell which consists of a two input multiplexer and a shift register. The output scan cell is attached to the output of a given component module and is considered a part of that component module for purposes of the scan test system. Second is an input scan cell which consists of a shift register. The input scan cell provides a test input signal for a given component module within an integrated circuit. The input scan cell is considered part of the component module to which it provides the input test signal. Component modules which receive their input from the boundary of an integrated circuit do not have input scan cells since a test input signal can be provided directly to the input pins for that component module. Component modules which have outputs on the boundary of an integrated circuit will not have output scan cells since the output pins can be read directly to verify the output signal. Assuming that a component module does not exist on the boundary of an integrated circuit, that component module will have both an input scan cell which will provide a test input signal and an output scan cell coupled to the output of the component module. The input scan cell and output scan cell are considered part of the component module for scan test system purposes.

The interconnection signal path between Module A 12 and Module B 18 is shown in FIG. 2 by Roman numerals I, II, III, IV. I-II-III-IV defines the interconnection signal path which must be verified by the scan test system. V, VI, and VII illustrate the signal path from the output of Module B 18 to the output of an output scan cell 102 coupled to the output of Module B 18. Recall that for purposes of scan test system design, the input scan cells and output scan cells are considered a part of the component module to which they apply. In FIG. 2, component Module A 12 consists of Module A 12 and output scan cell 62. Module A 12 does not have an input scan cell since its input comes from the boundary of integrated circuit 10. Component Module B 18 consists of input scan cell 76, Module B 18, and output scan cell 102.

Module A 12 receives its input signal. from the boundary of integrated circuit 10 and, therefore, does not have an input scan cell to provide test input signals. Since Module B 18 has its input coupled to the output of Module A 12, Module B 18 has an input scan cell 76 to provide test input signals for Module B 18. Module A output 16 has an output scan cell 62 coupled to it so that Module A output 16 can be verified. Similarly, Module B output 20 has an output scan cell 102 coupled to it so that Module B output 20 can be verified. In the sample integrated circuit shown in FIG. 2, Module B 18 provides an output which is coupled to another component module within integrated circuit 10. Therefore, Module B 18 requires output scan cell 102 in order to verify Module B output 20.

Output scan cell 62 is used in the verification of the operational integrity of both Module A 12 and Module B 18. Output scan cell 102 is used in the verification of the operational integrity of both Module B 18 and Module C 22, Module C 22 is illustrated in FIG. 1. Output scan cell 62 consists of a multiplexer 64 and a shift register 66. An input scan cell 76 is coupled to one of the inputs of multiplexer 64 so that a test signal provided to input scan cell 76 can be forwarded to a Module B input 60. Multiplexer 64 determines whether output scan cell 62 forwards Module A output 16 to Module B input 60 or forwards an input test signal from input scan cell 76 to Module B input 60. A mode select signal 68 determines the operation of multiplexer 64. When mode select signal 68 indicates output test mode, Module A output 16 is coupled to a multiplexer output 70 so as to forward Module A output 16 to Module B input 60. Mode select signal 68 of output test mode is also used for the normal operation of the integrated circuit since it forwards the output of the preceding component module to the input of the succeeding component module.

Module B 18 processes Module B input 60 and places the output on Module B output 20. Output scan cell 102 is coupled to Module B output 20. Output scan cell 102 consists of a multiplexer 104 and a shift register 106. Multiplexer 104 determines whether Module B output 20 is forwarded to the next component module or whether a test input signal from an input scan cell coupled to the other input of multiplexer 104 is forwarded to the next component module. A mode select signal 122 determines whether multiplexer 104 operates in output test mode or input test mode as described with relation to mode select signal 68.

When mode select signal 68 indicates output test mode, component Module A 12 on integrated circuit 10 will be scan tested and have its inputs and outputs verified. When mode select signal 68 indicates input test mode, component Module B 18 on integrated circuit 10 will be scan tested and have its inputs and outputs verified. In addition, when mode select signal 68 indicates input test mode, component Module A output 16 will be isolated from the input of the succeeding component Module B input 60 so that a test input signal can be provided to Module B input 60. Mode select signal 122 will indicate output test mode when mode select signal 68 indicates input test mode since Module B output 20 must be verified. Thus, component modules coupled to one another have mode select signals for their output scan cells indicating different modes. When the mode select signal for an output scan cell preceding a given component module indicates input test mode, the mode select signal for the output scan cell coupled to the given component module's output will indicate output test mode. This causes a test input signal to be provided to the given component module and the output of that given component module to be read and verified. When all mode select signals within integrated circuit 10 indicate output test mode for all component modules, all component modules which are interconnected pass signals directly between the modules. Therefore, integrated circuit 10 functions in normal processing mode. Only when interconnected component modules have opposite mode select signals will integrated circuit 10 have its scan test system operational.

Component modules which may receive input signals from outside integrated circuit 10 receive their test input signals when the corresponding mode select signal indicates output test mode for that component module. The inputs to these component modules are referred to as coming from the boundary of the integrated circuit. Also, component modules which generate output signals for use outside of integrated circuit 10 will have their output signals verified when the mode select signal for the preceding component module indicates input test mode. The outputs from these component modules are referred to as occurring on the boundary of the integrated circuit. Component modules which are not interconnected with other component modules on integrated circuit 10 may have their scan test performed during either the first or second step of the scan test depending upon the scan test system design. In that case, neither an input scan cell or an output scan cell is necessary to scan test the component module since its input pins and output pins both occur on the boundary of integrated circuit 10.

When mode select signal 68 indicates output test mode for output scan cell 62 coupled to Module A 12, a test signal is introduced into Module A 12 via Module A input 14. The test signal is processed in Module A 12 and is output on Module A output 16. Multiplexer 64, operating in output test mode, receives Module A output 16 and forwards the signal to multiplexer output 70. The signal is captured by shift register 66 via captured output 72. Shift register output 74 contains the output of Module A 12 and provides the output on a pin of integrated circuit 10 so that the output can be read and verified. Thus, shift register output 74 can be used to verify the operational integrity of Module A 12. A scan test of Module A 12 using output scan cell 62 verifies the interconnection signal path between Module A 12 and Module B 18 indicated by I-II-III. Thus, the only remaining signal path between Module A 12 and Module B 18 to be verified is indicated by III-IV. Therefore, after the test of the operational integrity of Module A 12, the only scan test verification left to verify the operation of and interconnection between Module A 12 and Module B 18 is the operational integrity of Module B 18 and the interconnection signal path indicated by III-IV.

When mode select signal 68 of output scan cell 62 indicates input test mode, a test signal 80 is introduced into Module B's input scan cell 76. Test signal 80 is received by input scan cell shift register 78. Input scan cell shift register 78 then forwards test signal 80 to input scan cell output 82. Input scan cell output 82 is connected directly to an input of multiplexer 64 in Module A's output scan cell 62. Input scan cell output 82 is connected to multiplexer output 70 when mode select signal 68 indicates input test mode.

One of the advantages of the present invention is that the scan test system incurs no silicon surface overhead since input scan cell output 82 can be layered over or under multiplexer output 70 which signal path is indicated by III-IV. These two layers could be two different metals or they could be the same metal separated by an insulating layer.

When multiplexer 64 receives a mode select signal 68 indicating input test mode, it shifts input scan cell output 82 to multiplexer output 70. Multiplexer output 70 is connected directly to Module B input 60. Therefore, test signal 80 is routed to Module B input 60 after passing through input scan cell 76 and output scan cell 62. When mode select signal 68 indicates input test mode, mode select signal 122, the mode select signal for output scan cell 102 which is coupled to Module B 18 indicates output test mode so that the output of Module B 18 can be captured in order to verify the operational integrity of Module B 18. After Module B 18 processes the input, Module B output 20 is captured by output scan cell 102 where it is made available for verification on shift register output 112 in order to verify the operational integrity of Module B 18. If Module B 18 passes the scan test, then signal path III-IV is verified to function properly. Thus, since the scan test of Module A 12 verifies the signal path I-II-III and the scan test of Module B 18 verifies the signal path III-IV, signal path I-II-III-IV is. verified, and the scan test of Module A 12, Module B 18, and the interconnection therebetween is complete in two steps. In addition, after Module B 18 is verified to function properly, the signal path V-VI-VII is also verified to function properly. Therefore, the scan test of Module B 18 verifies the operational integrity of Module B 18, the signal path indicated by III-IV, and the signal path indicated by V-VI-VII.

Figure 3:
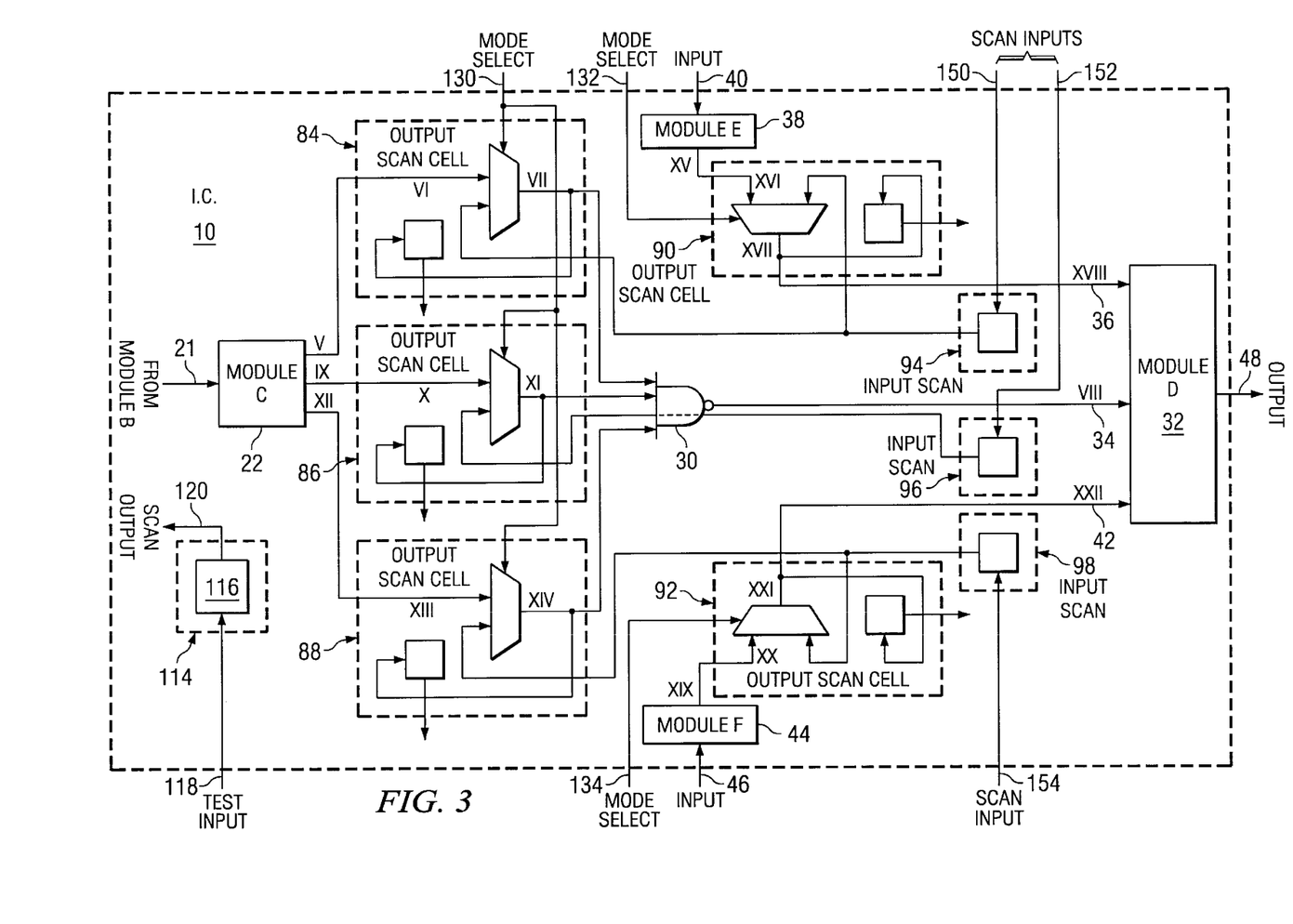
FIG. 3 is a schematic block diagram illustrating a scan test system as used with a more complex interconnection between two modules.

FIG. 3 represents a portion of integrated circuit 10 illustrated in FIG. 1. Specifically, FIG. 3 includes Module C 22, Module D 32, Module E 38, Module F 44, and the interconnections between those modules. This portion of integrated circuit 10 illustrates a module with multiple inputs from different modules and a module with multiple outputs which is interconnected with another module using glue logic. Glue logic refers to digital logic circuitry which may exist between two component modules on an integrated circuit. The scan test system of the circuit illustrated in FIG. 3 operates in essentially the same manner as previously discussed. The scan test system of the present invention treats the glue logic as part of Module D 32 and still requires just two steps to complete. Therefore, the glue logic is tested when the operation of Module D 32 is verified.

Referring again to FIG. 3, Module C 22, Module E 38, and Module F 44 provide the three inputs for Module D 32. The three outputs of Module C 22 are connected to a three input NAND gate 30 which is connected to first Module D input 34. The outputs of Module E 38 and Module F 44 are connected to second Module D input 36 and third Module D input 42, respectively.

A mode select signal 130 provides the mode selection for an output scan cell 84, an output scan cell 86, and an output scan cell 88. The three output scan cells utilize the same mode select signals since they are all coupled to the same module, Module C 22. Thus, mode select signal 130 is the mode select signal for Module C's output scan cells. When mode select signal 130 indicates output test mode, output scan cell 84, output scan cell 86, and output scan cell 88, function in the same manner as output scan cell 62 described above with reference to FIG. 2. Therefore, each output of Module C 22 can be captured and verified by the associated output scan cell. In addition, when mode select signal 130 indicates output test mode, the mode select signal for the output scan cell immediately preceding Module C is set to input test mode. This allows a test input signal 118 to be provided to Module C input 21 via the immediately preceding output scan cell. Test input signal 118 is provided to Module C's input scan cell 114. Input scan cell 114 consists of a shift register 116. Shift register 116 forwards input test signal 118 to the immediately preceding output scan cell via input scan cell output 120. Input scan cell output 120 is coupled to the multiplexer of the immediately preceding output scan cell, and the immediately preceding output scan cell is coupled to Module C input 21.

Module E's output scan cell 90 has a mode select signal 132, and Module F's output scan cell 92 has a mode select signal 134. The outputs of Module E 38 and Module F 44 can be captured and verified as described above when output scan cell 90 and output scan cell 92, respectively, are in output test mode. When the operational integrity of Module C 22 is verified, Module B's output scan cell 102, the output scan cell immediately preceding Module C 22 which is illustrated in FIG. 2, is set to input test mode so that test signal 118 applied to shift register 116 in input scan cell 114 is forwarded to Module C input 21 via shift register output 120 and Module B's output scan cell 102.

The first step in the scan test system for this portion of integrated circuit 10 is to verify the operational integrity of Module C 22, Module E 38, and Module F 44. Recall that modules which are not directly connected can have their operational integrity verified in the same scan test step. A successful test of these cells proves that the signal paths indicated by V-VI-VII, IX-X-XI, XII-XIII-XIV, XV-XVI-XVII, and XIX-XX-XXI are all functioning properly. The second step of the scan test system is to verify the operational integrity of Module D 32. This is done by indicating an input test mode on mode select signal 130, mode select signal 132, and mode select signal 134. Appropriate test signals are sent to Module D's input scan cells, input scan cell 94, input scan cell 96, and input scan cell 98. As described above, these test signals are sent to the output scan cell to which the input scan cell is coupled where they are forwarded along the interconnection path to the appropriate Module D 32 input. Specifically, input scan cell 94 forwards a test input signal 150 to output scan cell 90 which then forwards the test signal to second Module D input signal 36. Input scan cell 96 forwards a test signal 152 to output scan cell 86 which then forwards the test signal to NAND gate 30 which then forwards an appropriate test signal to first Module D input signal 34. Input scan cell 98 forwards a test signal 154 to output scan cell 92, which then forwards the test signal to third Module D input signal 42.

In addition, input scan cell 94 and input scan cell 98 also provide the test signals for two of the inputs to NAND gate 30. Thus, input scan cell 94 supplies test signal 150 to both output scan cell 84 and output scan cell 90. Likewise, input scan cell 98 provides test signal 154 to output scan cell 92 and output scan cell 88. However, each input to NAND gate 30 could have a separate input scan cell. Thus, Module D 32 could have up to five input scan cells since there are five inputs to Module D 32 and NAND gate 30. Recall that NAND gate 30 is considered part of Module D 32 for scan test purposes. After Module D 32 processes the test signal inputs, the output signal is available on Module D output 48 for verification. After the operational integrity of Module D 32 has been verified, signal paths VII-VIII, XI-VIII, XIV-VIII, XVII-XVIII, and XXI-XXII have all been verified. Therefore, the operation of each component module has been verified in addition to all of the interconnections between these component modules.

Figure 4A:
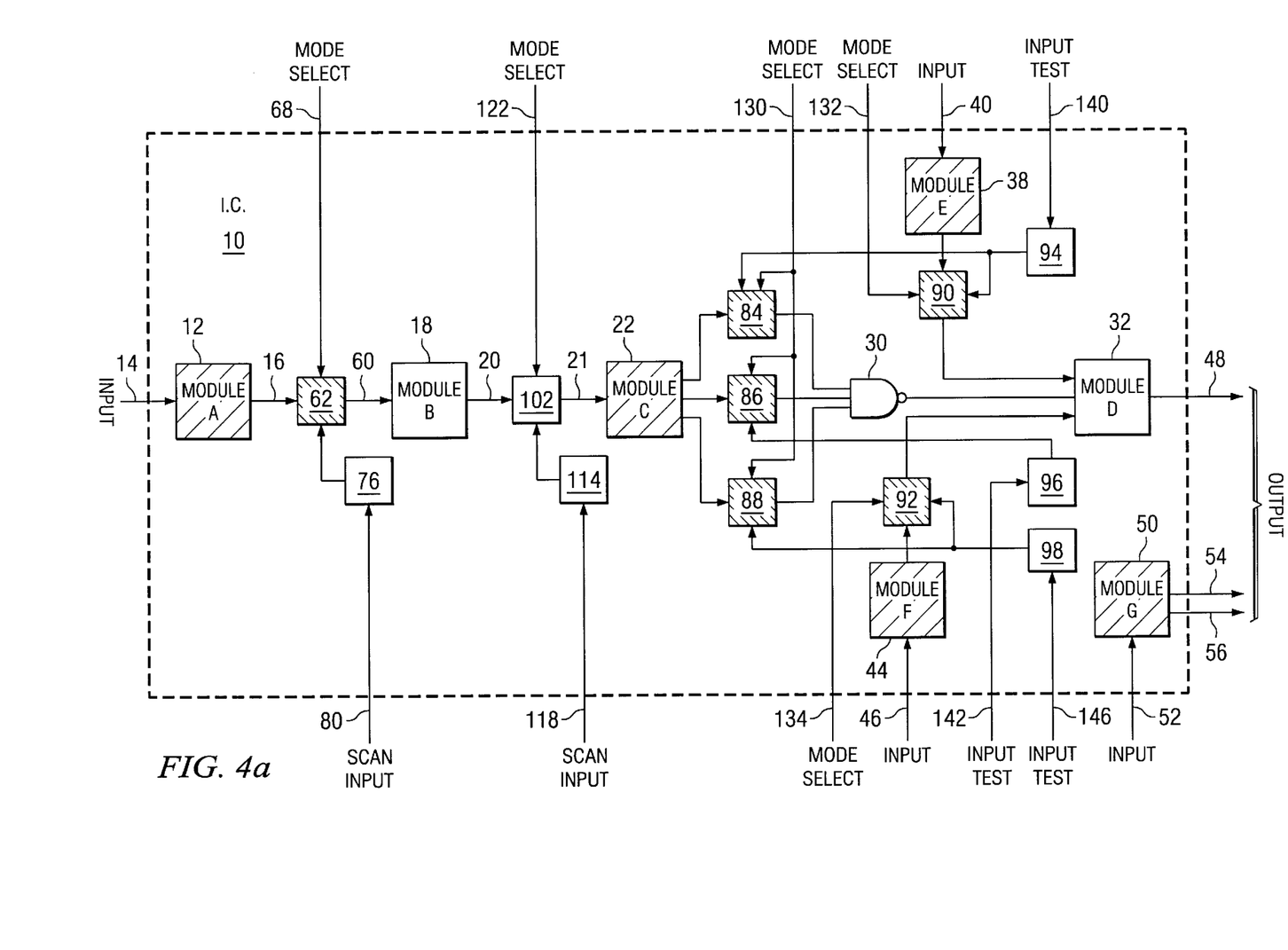
FIG. 4a is a block diagram illustrating a first step in a two-step scan test system.
Figure 4B:
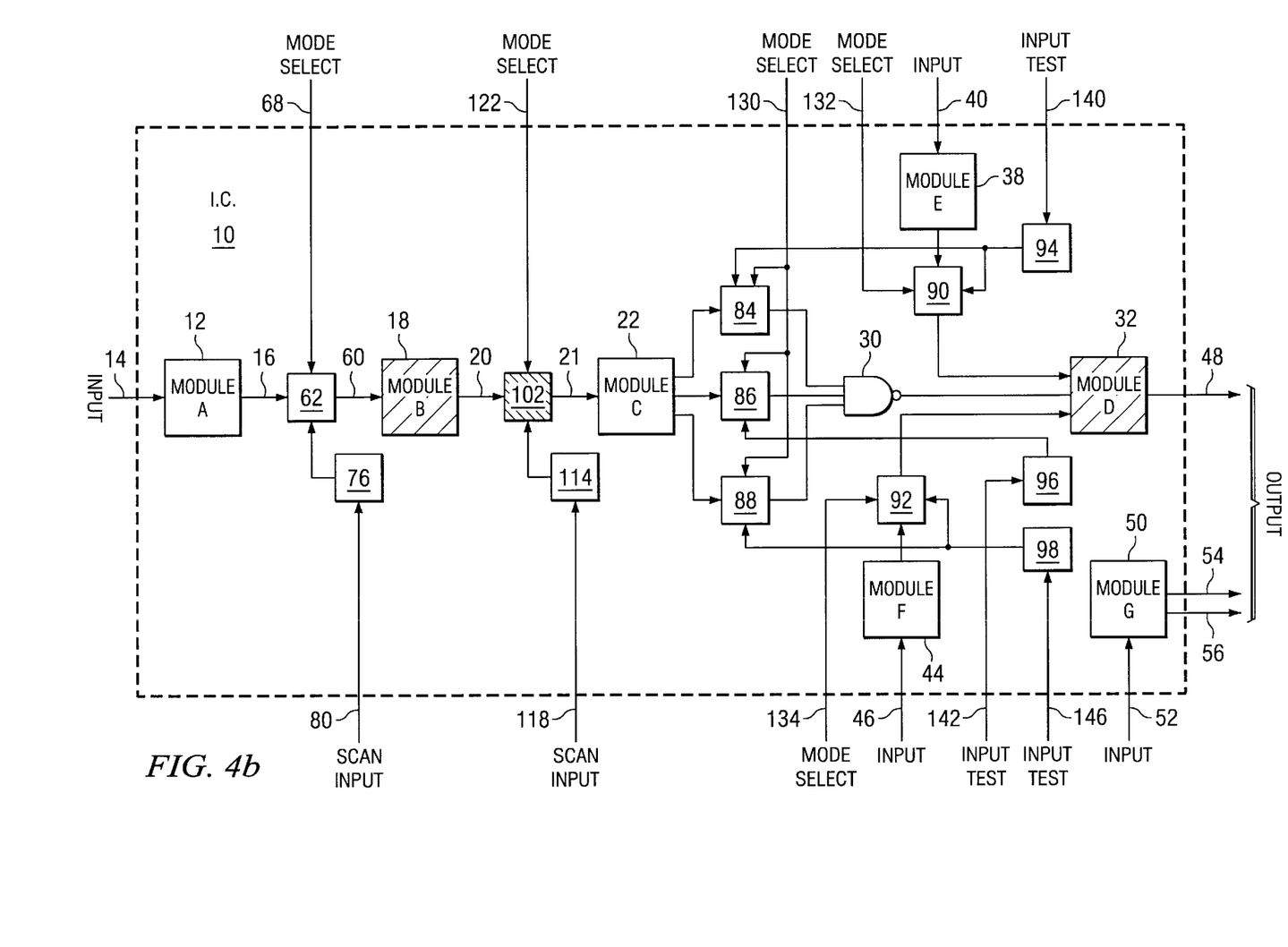
FIG. 4b is a block diagram illustrating a second step in the two-step scan test system.

FIG. 4a and FIG. 4b illustrate the two-step scan test system for verifying the operational integrity of illustrative integrated circuit 10. These figures illustrate which component modules have their operational integrity verified during each step of the two-step scan test process. FIG. 4a illustrates the first step of the scan test process, and FIG. 4b illustrates the second step of the two-step scan test process.

Referring to FIG. 4a, mode select signal 68, mode select signal 130, mode select signal 132, and mode select signal 134, are all set to output test mode thereby verifying the operational integrity of Module A 12, Module C 22, Module E 38, and Module F 44. Component modules which are shaded have their operational integrity verified during the first step of the two step scan test process. The output scan cells which are shaded, output scan cell 62, output scan cell 84, output scan cell 86, output scan cell 88, output scan cell 90, and output scan cell 92, are set to output test mode during the first step of the two-step scan test process. It should be noted that adjacent component modules have their mode select signals set to opposite settings during a given step of the scan test for integrated circuit 10. The opposite settings for adjacent component modules allow the output scan cell for the preceding component module to forward the test signal supplied by the input scan cell of the component module being tested to the input of that component module. It also allows the output scan cell for the component module being tested to capture and verify the output of that module.

Referring again to FIG. 4a, mode select signal 122 is set to input test-mode. This allows test input signal 118 to be for-warded to Module C input 21. Note that Module A 12, Module E 38, and Module F 44 all receive their inputs from outside of integrated circuit 10. Therefore, those modules do not have input scan cells which would require the immediately preceding output scan cell to be set to input test mode. Module G 50 is not connected to any other component module. Thus, it does not have an output scan cell, and therefore does not have a mode select signal. Module G 50 could be scan tested in either step of the two-step scan test. In this illustration, Module G 50 is verified during the first step of the scan test process.

Referring now to FIG. 4b, the operational integrity of the shaded component modules are verified-in the second step of the scan test process, and the shaded output scan cell is set to output test mode. Note that NAND gate 30 and Module D 32 are verified in the same step since glue logic is considered part of the component module to which it provides an input. Mode select signal 68, mode select signal 130, mode select signal 132, and mode select signal 134 are all set to input test mode. Input test mode allows test signal 80 to be forwarded from input scan cell 76 to Module B 18 via output scan cell 62. Similarly, input test signals 140, 142, and 146 are forwarded to the appropriate inputs of Module D 32.

Mode select signal 122 is set to output test mode so that output scan cell 102 can capture Module B output 20 in order to verify the operational integrity of Module B 18. Module D 32 does not have an output scan cell since Module D output 48 occurs on the boundary of integrated circuit 10. Therefore, Module D output 48 exists on a pin of integrated circuit 10. In addition, Module D 32 does not have any output scan cell since it does not provide input to another component module. At the end of the second step illustrated in FIG. 4b, every component module has been verified and the interconnections between all component modules have been verified. Therefore, the operational integrity of the entire integrated circuit illustrated by integrated circuit 10 is verified in two steps.

Figure 4C:
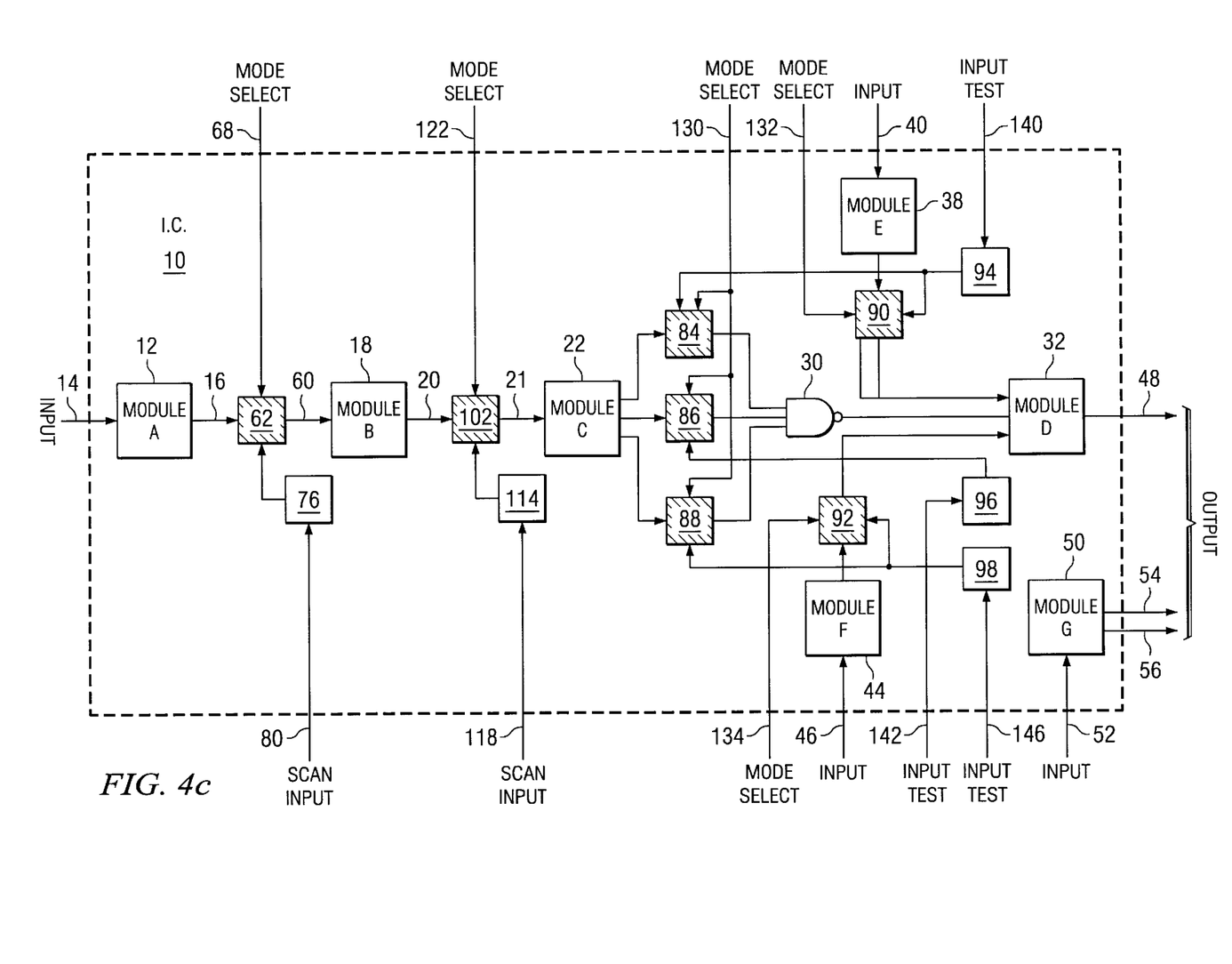
FIG. 4c is a block diagram illustrating a modularized integrated circuit in normal operation mode.

FIG. 4c illustrates the normal processing mode for integrated circuit 10. All output scan cells have their mode select signals set to output test mode. For ease of identification, all output scan cells in FIG. 4c are shaded. When all component modules are operating in output test mode, integrated circuit 10 is functioning in a normal manner since output test mode sends a component module's output directly to the succeeding component module.

According to the teachings of the present invention, a scan test system for integrated circuits consisting of multiple component modules and the interconnections therebetween is provided that utilizes a more efficient scan test design. The advantages of the improved scan test design include a simpler structure, fewer electrical components, and the requirement of only two scan test steps in order to verify the operational integrity of the entire integrated circuit.

Thus, it is apparent that there has been provided in accordance with the present invention, an improved system and method for testing the operation of component modules of an integrated circuit and the interconnections therebetween that satisfy the advantages set forth above. Although the present invention and its advantages have been described in detail, it should be understood that various changes, substitutions, and alterations readily apparent to those skilled in the art may be made herein without departing from the spirit and the scope of the present invention as defined by the following claims.

What is claimed is:

1. A system for testing the operation of on-chip modules and the interconnections between those on-chip modules, comprising:

an output scan cell operable to capture an output signal of a first on-chip module, the captured output signal used to verify the proper operation of the first on-chip module and a signal path from the output of the first on-chip module to the output scan cell;

an input scan cell operable to forward a test signal to an input of a second on-chip module via the output scan cell, the forwarded test signal used to verify the proper operation of the second on-chip module and a signal path from the output scan cell to the input of the second on-chip module thereby verifying the proper operation of an interconnection signal path between the output of the first on-chip module and the input of the second on-chip module; and a mode select signal which selects an operational mode of the output scan cell, the mode select signal being either input test mode or output test mode.

2. The system of claim 1, wherein the output scan cell includes:

an output scan multiplexer coupled to two inputs, an output, and the mode select signal, the two inputs consisting of the output signal of the first on-chip module and an output of the input scan cell, the output coupled to the input of the second on-chip module or a logic gate; and an output scan cell shift register coupled to the output scan cell multiplexor output and operable to capture an output signal of the output scan cell multiplexor in response to the mode select signal Indicating output test mode.

3. The system of claim 2, wherein the input scan cell includes an input scan cell shift register coupled to an input of the output scan cell multiplexor, the input scan cell shift register operable to forward a test signal to the input of the output scan cell multiplexor which will then forward the test signal to either the input of the second on-chip module or the logic gate in response to the mode-select signal indicating input test mode.

4. The system of claim 3, wherein the signal path from the input scan cell shift register to the output scan cell multiplexor is overlaid on an interconnection signal path between the output of the scan cell multiplexor and the input of the second on-chip module thereby incurring no on-chip surface overhead.

5. The system of claim 1, wherein the interconnection signal path between the output of the first on-chip module and the input of the second on-chip module includes one or more logic gates providing glue logic for the interconnections between on-chip modules.

6. The system of claim 1, wherein the mode select signal of input test mode allows a test signal applied to the input scan cell to be forwarded to the input of the second on-chip module via the output scan cell, the input test mode being used to verify the proper operation of the second on-chip module and the proper operation of the interconnection signal path between the output scan cell and the input of the second on-chip module.

7. The system of claim 1, wherein the mode select signal of output test mode allows the output of the first on-chip module generated by a test signal provided to the first on-chip module's input to be captured by the output scan cell, the output test mode being used to verify the proper operation of the first on-chip module and the proper operation of the signal path from the output of the first on-chip module to the output scan cell.

8. The system of claim 1, wherein the mode select signal of output test mode allows a signal to pass directly from the first on-chip module to the second on-chip module for normal processing.

9. A method for testing on-chip modules and interconnections between those on-chip modules, comprising:
  receiving a mode select signal, the mode select signal indicating either input test mode or output test mode;
  capturing an output of a first on-chip module in response to the mode select signal indicating output test mode;
  receiving a test signal in an input scan cell;
  forwarding the test signal from the input scan cell to an output scan cell coupled to an input of a second on-chip module in response to the mode select signal indicating input test mode; and
  forwarding the test signal from the output scan cell to the second on-chip module input in response to the mode select signal indicating input test mode.

10. The method of claim 9, further comprising verifying the proper operation of the second on-chip module and the proper operation of an interconnection signal path between the output scan cell and the input of the second on-chip module in response to the mode select signal indicating input test mode.

11. The method of claim 9, further comprising verifying the proper operation of the first on-chip module and the proper operation of a signal path from the output of the first on-chip module to the output scan cell.

12. The method of claim 9, further comprising verifying that an on-chip module generates a proper output signal for an input test signal.

13. The method of claim 9, further comprising verifying that an input signal path functions properly for an on-chip module.

14. The method of claim 9, further comprising verifying that an output signal path functions properly for an on-chip module.

15. The method of claim 9, further comprising verifying that an interconnection signal path between two on-chip modules functions properly.

16. The method of claim 9, further comprising verifying the proper functioning of interconnection signal paths between a plurality of on-chip modules.

17. A system for testing the operation of on-chip modules and the interconnections between those on-chip modules, comprising:
  a plurality of component modules which are part of an integrated circuit formed on a semiconductor chip wherein some of the inputs and outputs to the plurality of component modules exist on the boundary of the integrated circuit;
  a plurality of output scan cells coupled to the outputs of component modules which do not exist on the boundary of the integrated circuit, each of the plurality of output scan cells operable to capture an output signal from the component module to which it is coupled;
  a plurality of input scan cells, the plurality of input scan cells providing test input signals to component modules which do not have inputs existing on the boundary of the integrated circuit, the test input signals used to verify the proper operation of the component modules, the test input signals used to verify signal paths from the plurality of output scan cells to the inputs of the component modules, each of the plurality of input scan cells coupled to one of the plurality of output scan cells such that the test input signal can be forwarded to the component module via the output scan cell;
  a plurality of mode select signals, each of the plurality of mode select signals coupled to a corresponding output scan cell and indicating either input test mode or output test mode.

18. The system of claim 17, wherein each of the plurality of output scan cells includes:
  an output scan multiplexor coupled to two inputs, an output, and the corresponding mode select signal, the two inputs consisting of the output signal of the component module to which the output scan cell is coupled and an output of one of the plurality of input scan cells, the output coupled to the input of another of the plurality of component modules; and
  an output scan cell shift register coupled to the output scan cell multiplexor output and operable to capture an output signal of the output scan cell multiplexor in response to the corresponding mode select signal indicating output test mode.

19. The system of claim 18, wherein each of the plurality of input scan cells includes an input scan cell shift register coupled to an input of one of the plurality of output scan cell multiplexors, the input scan cell shift register operable to forward a test input signal to the input of the output scan cell multiplexor to which it is coupled which will then forward the test input signal to the input of a corresponding component module in response to the mode select signal for the output scan cell multiplexor indicating input test mode.

20. The system of claim 19, wherein the signal path from the input scan cell shift register to the output scan cell multiplexor is overlaid on an interconnection signal path between the output of the scan cell multiplexor and the input of the corresponding component module thereby incurring no on-chip surface overhead.

21. The system of claim 17, wherein a scan test of the integrated circuit is performed in two steps.

22. The system of claim 21, wherein during the first step of the scan test of the integrated circuit, the mode select signals for the plurality of output scan cells are set so that the mode select signals of output scan cells coupled to non-adjacent component modules are set to the same value and the mode select signals of output scan cells coupled to adjacent component modules are set to different values.

23. The system of claim 22, wherein during the second step of the scan test of the integrated circuit, the mode select signals for the plurality of output scan cells are switched to the value opposite of the value used during the first step of the scan test of the integrated circuit.

24. The system of claim 17, wherein the integrated circuit operates in normal mode when all mode select signals for all output scan cells are set to output test mode.

* * * * *